United States Patent [19] [11] 4,068,767
Tippetts [45] Jan. 17, 1978

[54] TRANSFER MECHANISM

[75] Inventor: Kenneth Boyd Tippetts, Glendale, Ariz.

[73] Assignee: Honeywell Information Systems Inc., Phoenix, Ariz.

[21] Appl. No.: 712,565

[22] Filed: Aug. 9, 1976

[51] Int. Cl.² .............................................. B65G 57/30
[52] U.S. Cl. .................................. 214/6 BA; 271/177; 271/212
[58] Field of Search .......................... 214/6 BA, 8.5 F; 271/131, 177, 212; 221/270, 272

[56] References Cited

U.S. PATENT DOCUMENTS

| 2,549,975 | 4/1951 | Knitter | 214/8.5 F |
| 3,335,699 | 8/1967 | Aiken et al. | 214/6 BA |
| 3,805,970 | 4/1974 | Eash | 214/8.5 F |

FOREIGN PATENT DOCUMENTS

| 408,602 | 9/1966 | Switzerland | 221/270 |

Primary Examiner—Robert J. Spar
Assistant Examiner—Ross Weaver
Attorney, Agent, or Firm—Edward W. Hughes; William W. Halloway, Jr.

[57] ABSTRACT

A transfer mechanism for withdrawing an object from the bottom of a stack of such objects in a first magazine and for inserting said object at the bottom of a stack of such objects in a second magazine. The magazines are removably mounted on bases positioned with respect to each other so that the openings in the magazines through which an object is removed from one and inserted into the other are essentially opposite one another and are spaced apart less than the corresponding dimension of an object. An extractor removes the bottommost fixture from the first magazine and inserts that object into the second magazine. Cam surfaces which project into the second magazine cause the stack of such objects therein to clear the opening in the second magazine and cause the object being loaded to move the stack of such objects upwardly with the most recently inserted object at the bottom of the stack.

4 Claims, 8 Drawing Figures

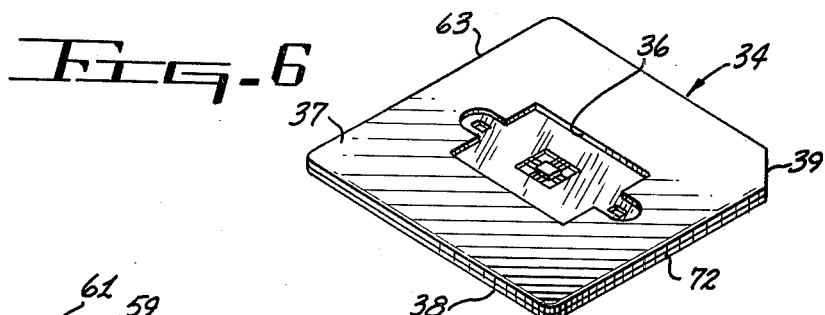
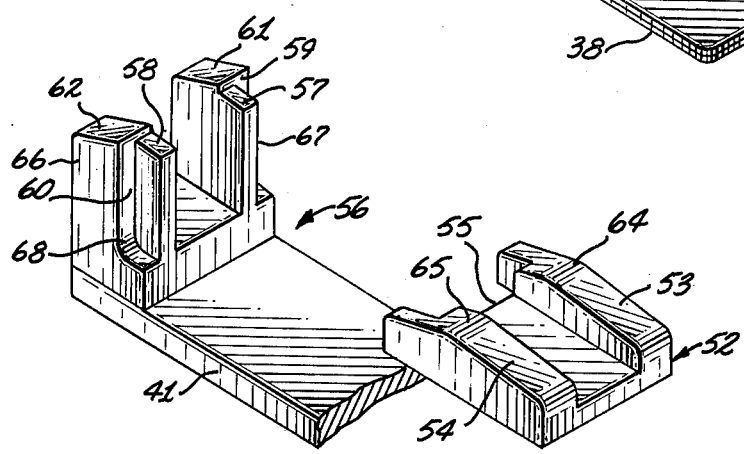
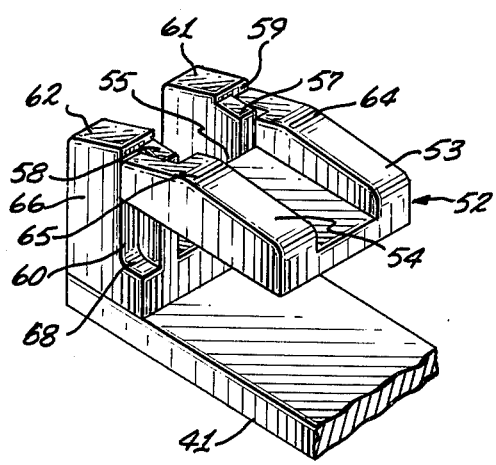

TRANSFER MECHANISM

CROSS REFERENCES TO RELATED APPLICATIONS

A. A fixture adapted to hold an integrated circuit chip mounted on a flexible beam lead is described and claimed in application Ser. No. 671,238 filed March 29, 1976, entitled Fixture for an Integrated Circuit Chip which issued as U.S. Pat. No. 4,007,479 on Feb. 8, 1977. This patent is assigned to the same assignee as the present invention. The fixture disclosed and claim in the above identified patent is of the type that can be transferred by the transfer mechanism of this invention.

B. A magazine adapted to hold a stack of integrated circuit chips mounted in fixtures such as are disclosed in the application identified in paragraph A. above and from which the fixtures can be removed by the transfer mechanism of this invention is described and claimed in an application Ser. No. 712,564 filed Aug. 9, 1976 entitled Magazine for a Plurality of Fixtures Holding Integrated Circuit Chips by K. Boyd Tippetts and assigned to the assignee of this invention.

C. A machine for assembling into a magazine of the type described and claimed in the application identified in paragraph B. above, a plurality of fixtures of the types described and claimed in the application identified in paragraph A. above, and using the transfer mechanism of this invention is described and claimed in an application Ser. No. 712,563 filed Aug. 9, 1976 entitled Sequencer by John L. Kowalski and K. Boyd Tippetts and assigned to the assignee of this application.

BACKGROUND OF THE INVENTION

1. Field of the Invention

This invention is in the field of transfer mechanisms for removing objects from the bottom of a stack of such objects stored in a first magazine and for loading and stacking such objects serially in a second magazine using the linear motion of an extractor and cam surfaces that project into the second magazine to stack such objects in the second magazine.

2. Description of the Prior Art

The development of integrated circuit (IC) chips, particularly medium and large scale IC chips, has created a need for improved manufacturing processes which lend themselves to automating the mounting of IC chips and their lead frames on substrates as part of the process of manufacturing compact electronic circuit packages which are also known as micropackages. The mounting of such a chip and its lead frame in a fixture, for testing the chip and its lead frame and to facilitate the mounting of such chips on substrates is know. However, in automating the process of manufacturing micropackages and since most micropackages require IC chips of several different types, it is desirable to assemble in a single holder, or magazine, the necessary number of fixtures holding appropriate types of IC chips used in manufacturing a given micropackage.

To automate this manufacturing step requires a mechanism to transfer a fixture from one magazine, a transferor magazine, into a second magazine, a transferee magazine. To simplify the mechanism, to insure its reliability, and to minimize the risk of damage to an IC chip and its lead frame, each such fixture is removed from the bottom of the stack of such fixtures in a transferor magazine and is loaded into and become, at least until the next fixture is loaded into the transferee magazine, the bottommost fixture in the stack of such fixtures in the transferee magazine.

The closest known relevant prior art is that which has been developed with respect to holders or magazines for film slides or transparencies; i.e., fixtures for holding segments of developed photographic film for use with a projector to project an enlarged image on a screen, for example. However, none of the prior art transfer mechanisms are capable of withdrawing the bottommost fixture of a first stack of such fixtures from a transferor magazine and bottom loading each such fixture into a stack of such fixtures in a transferee magazine.

SUMMARY OF THE INVENTION

The present invention provides a transfer mechanism for removing the bottommost object from a stack of like objects stored in a transferor magazine and inserting that object into a transferee magazine in which the object is inserted at the bottom of the stack of such objects. The mechanism requires only linear motion of an extractor to accomplish the transfer and stacking of an object. More particularly the transfer mechanism transfers, from one magazine to another, fixtures which are substantially identical in size and shape and which fixtures are adapted to hold an integrated circuit chip mounted on a flexible lead frame within a centrally located opening of the fixture. The parts of the transfer mechanism which contact a fixture during a transfer do not contact any part of the fixture in close proximity to the centrally located opening within which an IC chip is mounted to minimize the risk of damage to the chip during such a transfer.

The transfer mechanism of this invention has a support member or plate on which two bases are mounted. Magazines that are substantially identical in size and shape can be removably mounted on the bases. Each magazine is provided with an opening in one of its walls through which the objects or fixtures to be transferred can be inserted or removed by the transfer mechanism. The bases on which the magazines are mounted are positioned by positioning means with respect to each other so that corresponding openings of the magazine through which fixtures can be inserted or removed can be arranged to be opposite one another and substantially co-planar. The magazines are spaced apart a distance which is substantially less than the length of the object or fixture to be transferred, preferably a distance not greater than one half of said length. Transfer of a fixture is accomplished by an extractor which is operatively connected to a linear actuator. Thus, when the two bases are properly positioned with respect to each other, the extractor and the mechanism on which the extractor is mounted is free to move under the transferor magazine to the rear thereof to engage the bottommost fixture, to remove this fixture and to insert it into the transferee magazine. The second, or transferee, base is provided with a cam, the surfaces of which are contacted by the leading edge of the fixture as it is inserted into the transferee magazine. As a result, the fixture being inserted forces any fixtures then stacked in the transferee magazine to move upward. The position and shape of the cam surfaces are such that the stack of fixtures transferred into the second magazine will pivot about the higest points of the cam surfaces to uncover the opening in which a fixture is inserted by the transfer mechanism. As a result, a simple mechanism is provided which can unload from one magazine a fixture from the bottom of a stack of such fixtures and insert that fixture at the bottom of a stack of such fixtures in a second magazine.

The transfer mechanism is reliable and is designed to minimize the risk of damage to the IC chip which each fixture is adapted to have mounted on it. To assure this, the surfaces of the cam and the extractor which contact a fixture are split, or are divided, so that such surfaces do not come in contact with an IC chip mounted on a fixture being transferred.

The simplicity of the mechanism reduces the cost to produce, to operate, and to maintain the mechanism while permitting the automation of the transfer of fixtures holding IC chips from one magazine to another.

BRIEF DESCRIPTION OF THE DRAWINGS

Other objects, features and advantages of the invention will be readily apparent from the following description of the preferred embodiment taken in conjunction with the accompanying drawings, although variations and modifications may be effected without departing from the spirit and scope of the novel concepts of the disclosure, and in which:

FIG. 6 is an isometric view of a fixture.

FIG. 7 is an isometric view substantially illustrating the relationships between the extractor and cam of the invention when the extractor is in its extended position.

FIG. 8 is an isometric view substantially illustrating the relationship between the extractor and cam of the invention when the extractor is in its retracted position.

DESCRIPTION OF THE PREFERRED EMBODIMENT

Figure 1:
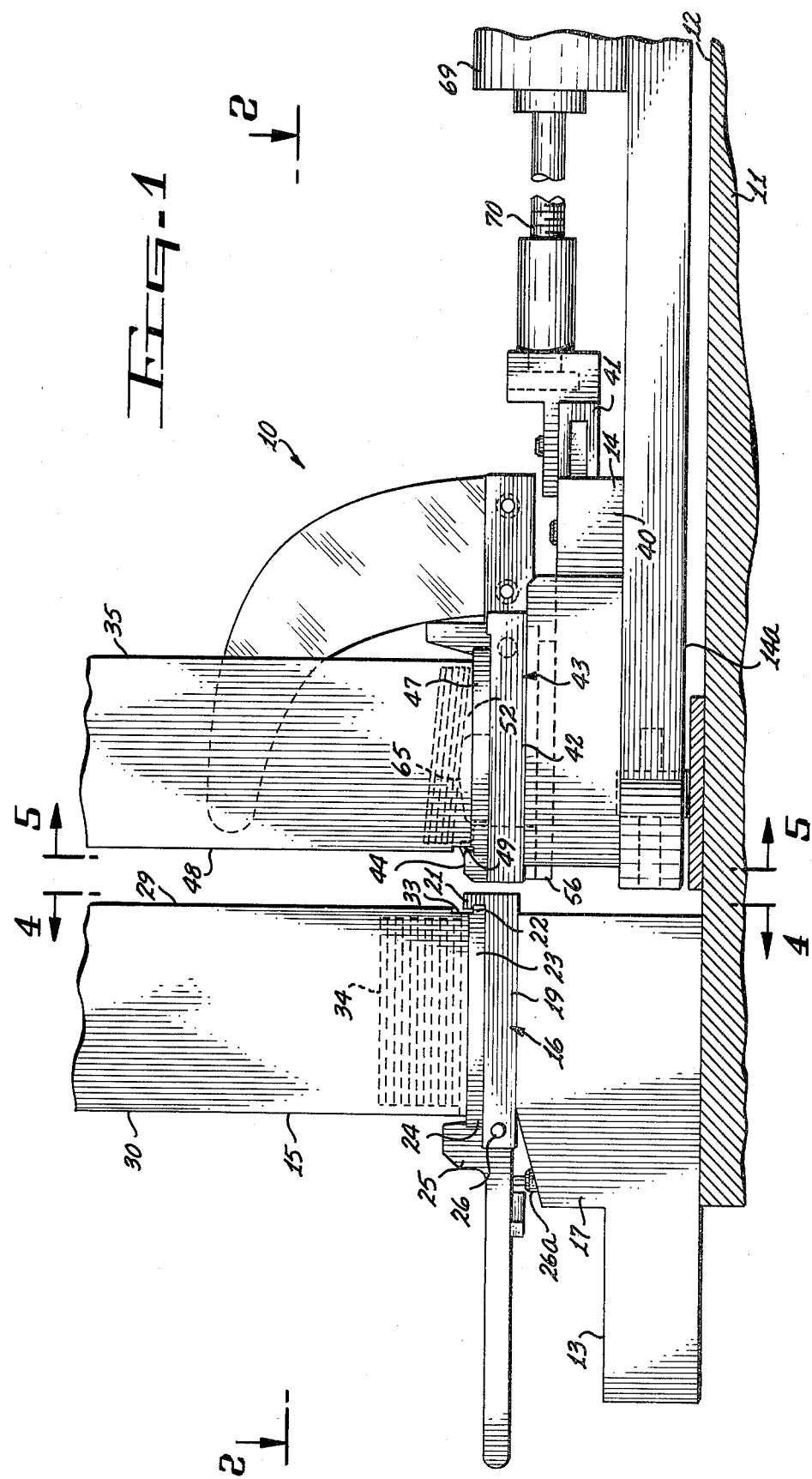
FIG. 1 is a fragmentary side elevation partly in section of the invention.
Figure 4:
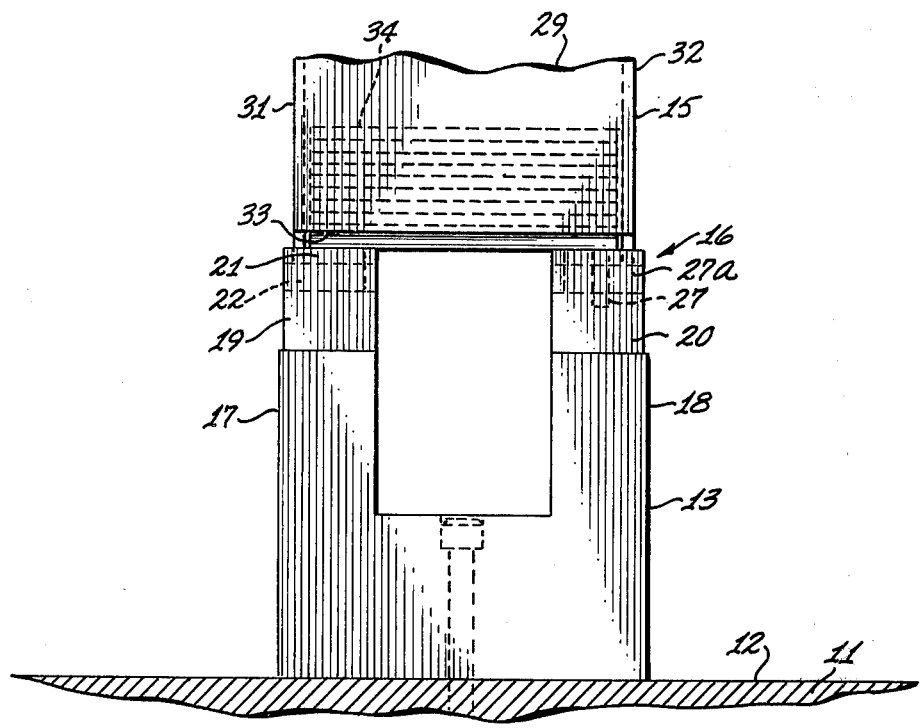
FIG. 4 is a section taken on line 4—4 of FIG. 2.

In FIG. 1, transfer mechanism 10 has a support plate, or support member 11, the top surface 12 of which defines a reference plane which is substantially horizontal and on which transferor base 13 is mounted. Transferee base 14 is mounted on positioning means 14a. Magazine 15 is removably mounted on base 13 by mounting means generally designated by reference number 16. Referring to FIG. 4, it can be seen that base 13 is provided with a pair of integral vertical side walls 17, 18 the inner sides of which define two of the walls of a space having a substantially rectangulr cross section. Mounting means 16 comprises a pair of holders 19, 20 which are fixedly attached to the top surfaces of walls 17, 18 respectively. Holder 19, as is best seen in FIG. 1, is provided with a catch 21 within which the front ledge 22 of rail 23 of magazine 15 fits. The back ledge 24 of rail 23 is engaged by latch 25. Latch 25 is mounted for rotation about pivot 26, and is urged in a direction to positively engage ledge 24 by spring plunger 26a to substantially rigidly mount magazine 15 on base 13. A key 27 is mounted in the catch 27a of holder 20 to cooperate with key slot in rail 28 to make it difficult, if not impossible to improperly place and securely fasten magazine 15 on mounting means 16. The shape and dimensions of base 13 and of mounting means 16 are such that magazine 15 and particularly the plane determined by the upper surfaces of the rails 23, 28 is substantially parallel to the planar surface 12 of plate 11.

Magazine 15 has four walls, a front wall 29, a back wall 30, a side wall 31 and a second side wall 32. A front opening 33 is formed at the bottom of front wall 29 of magazine 15, with the bottom surface of wall 29 defining the top surface of opening 33. The inner surfaces of walls 29, 30, 31, 32 define a rectangular parallelapiped in which a plurality of fixtures 34 can be readily stacked. The height of front opening 33 measured from the top surfaces of the rails 23, 28 to the bottom surface of wall 29 is such that one and only one fixture 34 can be inserted or removed through front opening 33.

In FIG. 6 a typical 34, which the transfer mechanism 10 is adapted to transfer from transferor magazine 15 to transferee magazine 35, is illustrated. Embodiments of fixture 34 are described in greater detail in the patent identified in paragraph A of the section of this application entitled Cross References to Related Applications. The outer surfaces of fixture 34 substantially define a rectangular parallelapiped. An opening, or aperture, 36 is formed in fixture 34 substantially in the center of upper surface 37. Fixture 34 is adapted to have an integrated circuit chip and its flexible lead frame positioned in fixture 34 so that the IC chip is located within aperture, or opening, 36 with the chip between the top and bottom surfaces 37, 38 of fixture 34. The distance between the top and bottom surfaces 37, 38 of fixture 34 is the height of fixture 34. In a preferred embodiment, top and bottom surfaces 37, 38 are substantially square except for one corner which may be removed to provide a key, or indicia, of orientation 39.

Figure 2:
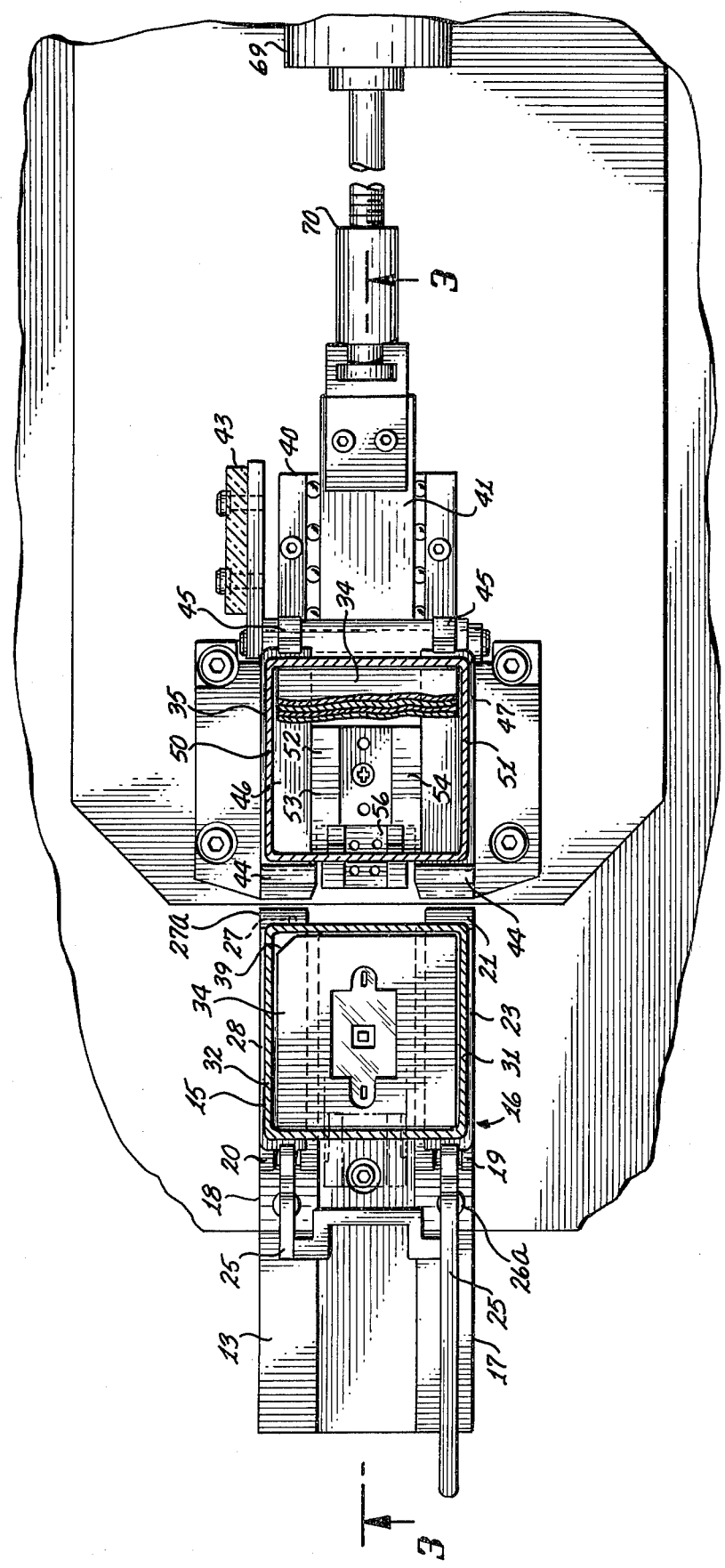
FIG. 2 is a section taken on line 2—2 of FIG. 1.
Figure 5:
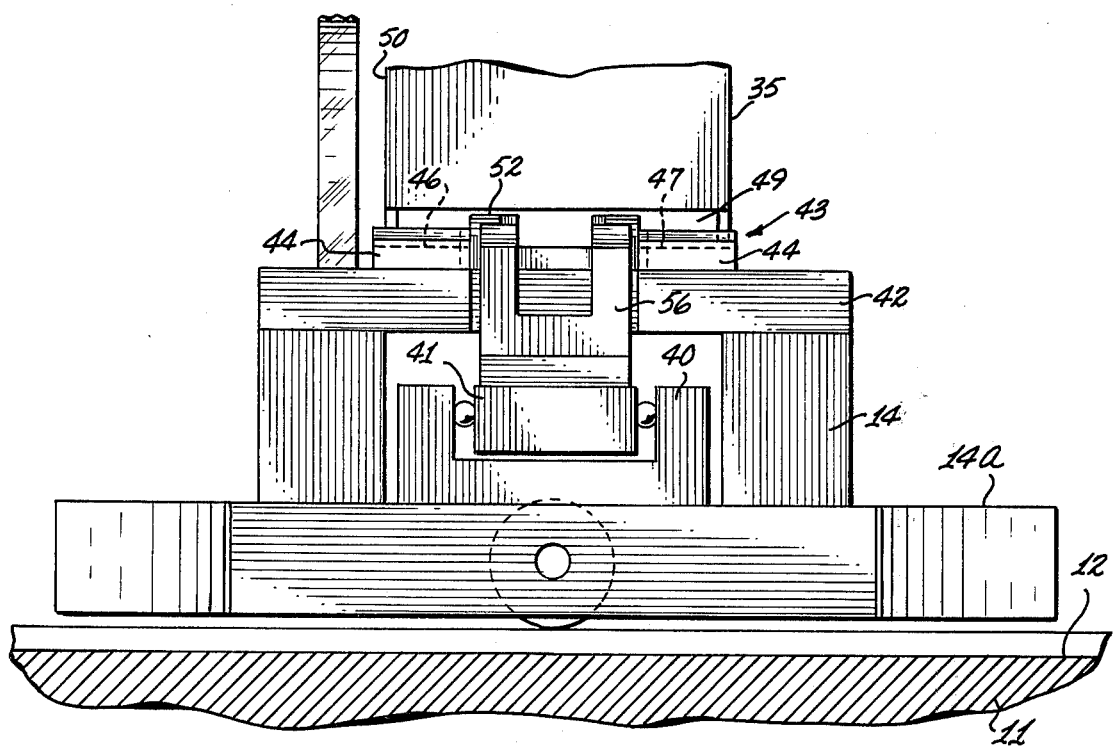
FIG. 5 is a section taken on line 5—5 of FIG. 2.

Base 14 is fixedly secured to positioning means 14a which is mounted on frame 11. As is illustrated in FIGS. 2 and 5, the width of base 14 is greater than the width of base 13 so that a conventional ball slide 40 can be positioned in the opening formed in base 14. Because only the moveable element 41 of ball slide 40 projects or moves into the opening in base 13, the opening in base 13 is made smaller in both width and depth than the opening in base 14. A spacer 42 is mounted on base 14 and defines the top surface of the space within which the ball slide 40 is located. In the embodiment illustrated, mounting means 43 of base 14 is made integral with spacer 42. Fixed catch 44 and latch 45 of mounting means 43 are the functional equivalents of corresponding components of mounting means 16; i.e., to removably mount magazine 35 on base 14.

The dimensions of base 14, spacer 42 and mounting means 43 are such that the plane determined by the top surfaces of rails 46, 47, of magazine 35 when mounted on base 14 are substantially parallel with the top surface 12 of pklate 11, and this plane is substantially co-planar with the plane determined by the top surfaces of rails 23, 28 of magazine 15 when magazine 15 is mounted on base 13 as is shown generally in FIG. 1. When base 13 and base 14 are positioned on plate 11 so that when magazine 15 is mounted on base 13 and magazine 35 is mounted on base 14, front wall 48 of magazine 35 is substantially opposite front wall 29 of magazine 15, and so that the front openings 33 and 49 of magazine 15, 35 are substantially opposite one another, thus the two magazines 15 and 35 are in position to transfer a fixture from one to the other. In this position side walls 32, 50 and 31, 51 of magazine 15, 35 are also substantially co-planar.

Cam 52, which is removably secured to spacer 42 in a preferred embodiment, has two can surface 53, 54 as is best illustrated in FIGS. 7 and 8. The surfaces 53, 54 are spaced apart, or divided, a distance which is preferably equal to or greater than the width of opening 36 in fixture 34, so that an IC chip held by a fixture 34 will not contact cam surfaces 53, 54 during a transfer operation, or to state it another way, cam surfaces 53, 54 can engage only the bottom surface 38 of a fixture 34 during a transfer operation. A slot 55 is formed in the front portion of cam 52 as can best be seen in FIG. 2 and FIG. 7 to permit cam 52 and extractor 56 to overlap slightly as is illustrated in FIGS. 2 and 8.

Extractor 56 is provided with a first pair of substantially horizontal planar surfaces 57, 58 a second pair of substantially vertical planar surfaces 59, 60 and a third pair of cam surfaces 61, 62 with the distance between each pair of surfaces being preferably equal to or greater than the width of opening 36 in a fixture 34 so that an IC chip mounted in a fixture 34 will not contact a surface of extractor 56 during a transfer operation. This reduces the risk of damage to the IC chip positioned within aperture 36 of a fixture 34. Extractor 56 is fixedly secured to one end of moveable element 41 of ball slide 40 and is moveable between a first extended position illustrated in dotted lines in FIG. 3 and a second retracted position illustrated in solid lines. In the first position, substantially vertical surfaces 59, 60 are positioned so that the lower most fixture 34 of a stack of such fixtures in magazine 15 will be free to move downwardly, until it is supported on the top surfaces of rails 23, 28. Thus, vertical surfaces 59, 60 can engage a vertical surface, or wall such as back wall 63 of the bottommost fixture 34. Shortly thereafter extractor 34 begins to move from its frist position to its second position. In the second position of extractor 56, vertical surfaces 59, 60 are sufficiently within the interior of magazine 35 so that a fixture 34, which has just been loaded into magazine 35, is free to pivot about the highest points 64, 65 of cam surfaces 53, 54 to clear front opening 49 so that the next fixture 34 can be loaded into magazine 35. The planar surfaces 57, 58 of extractor 56, which are substantially horizontal when extractor 56 is mounted on moveable element 41, are slightly below the plane determined by the top surfaces of rails 23, 28 of magazine 15 and of rails 46, 47 of magazine 35 when magazines 15, 35 are mounted on bases 13, 14. The extent that vertical surfaces 59, 60 project above the plane defined by the top surfaces of rails 23, 28 of magazine 15 and rails 46, 47 of magazine 35 must not exceed the height of a fixture 34. Cam surfaces 61, 62 of extractor 56 extend from the top of vertical surfaces 59, 60 to the forward wall 66 of extractor 56. The intersection of cam surfaces 61, 62 with forward wall 66 is slightly below surfaces 57, 58 so that front wall 66 will not contact a fixture 34 in magazine 15 when extractor 56 is cycled from its second, or retracted, position to its first, or extended, position. A pair of recesses 67, 68 are formed in extractor 56 so that surfaces 57, 58 of extractor 56 and a part of the cam surfaces 53, 54 of cam 52 overlap when extractor 56 is in its second, or retracted, position.

Figure 3:
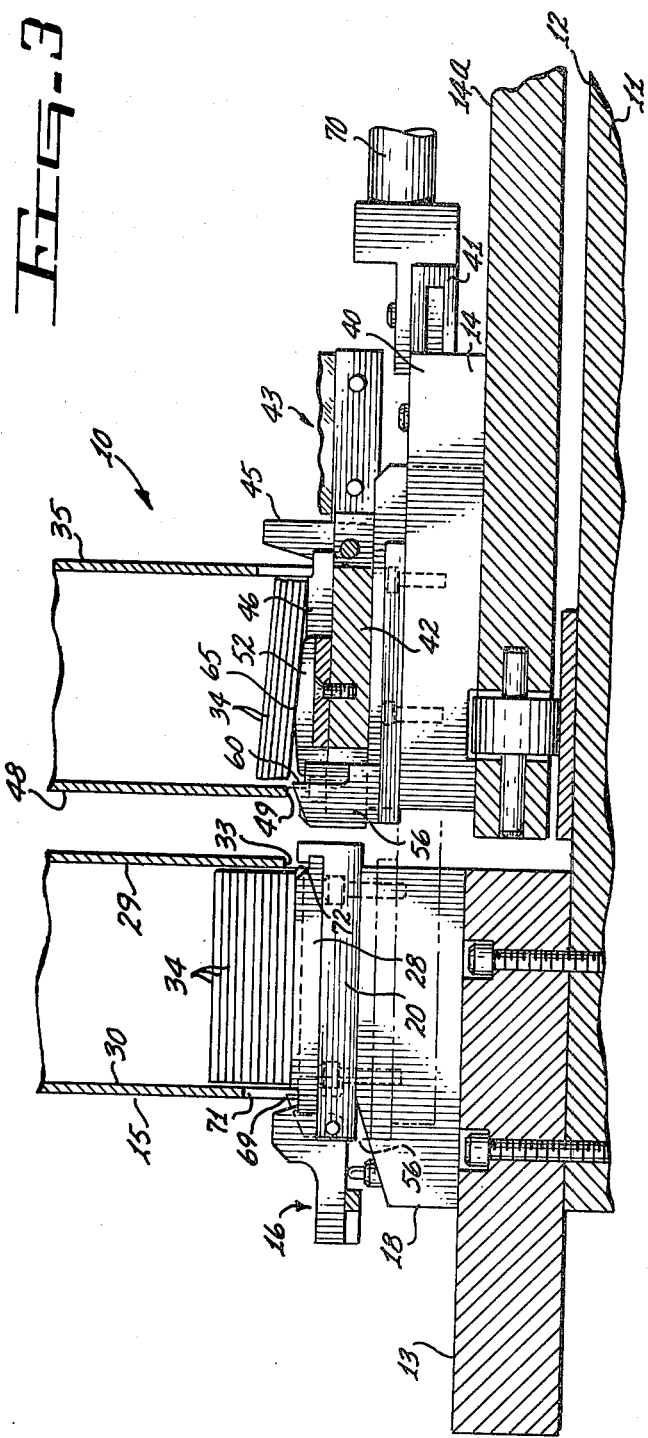
FIG. 3 is a fragmentary section taken on line 3—3 of FIG. 2.

Linear actuator 69 is mounted on positioning means 14a and is operatively connected by conventional connecting means 70 to moveable element 41 of ball slide 40 to cause extractor 56 to move between its two positions illustrated in FIG. 3. Actuator 69 can be of any conventional type powered by any suitable type of power which is readily available such as compressed air, hydraulic fluid, or electricity. In a preferred embodiment a pneumatic double acting cylinder is used.

In operation, a plurality of fixtures 34 are stacked vertically in magazine 15 with the bottommost one having part of its bottom surface 38 engaging the top surfaces of the rails 23, 28. The widths of the front openings 33 in magazine 15 and opening 49 in magazine 35 are slightly greater than the width of a fixture 34. The heights of the openings 33, 49 are such that only one fixture 34 can be removed through front opening 33 at any one time and only one fixture 34 can be inserted into front opening 49 at any one time.

A back opening 71 is formed in the back wall 30 of magazine 15 so that the highest surface of extractor 56 will not contact back wall 30 when extractor 56 is in its first position, i.e., when it has been moved underneath magazine 15 through the opening in base 13 and vertical surfaces 59, 60 are beyond the space within magazine 15 in which fixtures 34 are stacked. When actuator 69 is energized to cause extractor 56 to move from its second position to its first, cam surfaces 61, 62 displace upwardly the bottommost fixture 34 in the stack. Once extractor 56 is in its first position, the stack of fixtures 34 drops so that the bottommost fixture is supported on the top surfaces of rails 23, 28. When actuator 69 is energized, to cause through its operative connection with moveable element 41 the movement of extractor 56 from its first position to its second, vertical surfaces 59, 60 of fixture 56 engage the back wall of fixture 34 and moves the bottommost fixture 34 in the stack in magazine 15 through front opening 33. The top surfaces of the fixed catches of mounting means 43, such as catch 44, are below the plane defined by the top surfaces of rails 23, 28, 46 47 so that a fixture 34 will not contact any part of mounting means 43 during the transfer. The upper front edges of the rails 46 and 47 of magazine 35 are also beveled so that if the lower front edge 72 of a fixture 34 should be slightly below the plane determined by the top surfaces of rails 46, 47; fixture 34 will nevertheless be guided into magazine 35. The material from which each fixture 34 is made is relatively rigid, so that a fixture being transferred remains essentially horizontal during the transfer until its leading edge 72 has entered front opening 49 of magazine 35 because the distance between opening 33 and 49 is preferably not more than half the length of a fixture 34.

Substantially horizontal surfaces 57, 58 of extractor 56 support the bottom surface 38 of a fixture 34 during a transfer operation once the fixture is no longer supported by the top surfaces of rails 23, 28. The leading edge 72 will contact cam surfaces 53, 54 of cam 52 to wedge upwardly all fixtures 34 then stacked in magazine 35. Once a fixture 34 is loaded in magazine 35, it is no longer constrained from pivoting about the highest points 64, 65 of surfaces 53, 54 by the bottom surface of front wall 48, for example. When all constraints against such motion are removed, the weight of the fixture 34 being transferred and those in the stack above it, if any, cause the fixture 34 just transferred to tilt, or pivot, about the highest points 64, 65 of surfaces 53, 54 to clear, or unblock front opening 49 of transferee magazine 35.

When a second fixture 34 is to be transferred from magazine 15 to magazine 35, the extractor 56 is moved from its second position to its first by energizing actuator 69. As this occurs, cam surfaces 61, 62 of extractor 56 engage the bottom surface 38 of the bottommost fixture 34 stacked in magazine 15 and force that fixture and all those above it upwardly. Once extractor 56 has moved to its first position, cam surfaces 61, 62 no longer will contact the bottommost fixture 34, which is then free to move downwardly into engagement with the top surfaces of rails 23, 28. The transfer of a second fixture from magazine 15 to 35 is the result of energizing actuator 69, to move extractor 56 toward magazine 35 until it reaches its second position.

Each complete cycle of extractor 56 from its second position to the first position and then back to its second position when magazines 15 and 35 are properly positioned and a fixture is stored in magazine 15 will transfer a fixture 34 from a transferor magazine 15 into a transferee magazine 35. The maximum force required to stack up to 100 to 200 fixtures 34 in magazine 35 is relatively small and can be easily provided by a pneumatically powered linear actuator such as is used in a preferred embodiment. The magnitude of the forces applied to a fixture 34 during a transfer operation is insufficient to cause damage to IC chips and their lead frames which such fixtures are adapted to hold.

Transfer mechanism 10 has the advantages that extractor 56 can be moved in a straight line to remove the bottommost fixture 34 of a stack of such fixtures stored or held in magazine 15 and to insert the removed fixture into the bottom of a stack of such fixtures in magazine 35. The linear motion of extractor 56 not only transfers a fixture, but the interaction between the fixture being transferred and cam 52 causes each fixture so transferred to be vertically stacked in magazine 35. As a result, applicant's transfer mechanism is very reliable, is economical to manufacture and maintain, and accomplishes its function with substantially no risk of damage to a fixture and the device mounted on said fixture during such a transfer operation.

It should be evident that various modifications can be made in the described embodiment without departing from the scope of the present invention.

What is claimed is:

1. In combination:
a support member,
a first base mounted on said support member,
a first magazine adapted to have a plurality of substantially similar objects stacked in it,
means for removably mounting said first magazine on said first base,
a second base mounted on said support member,
a second magazine having a base and adapted to have a plurality of said objects transferred to and stacked in it, means forming an opening in the base of the second magazine,
means for removably mounting said second magazine on the second base,
cam means having a cam surface mounted on the second base, a part of the cam surface projecting through the means forming an opening in the base of the second magazine when the second magazine is mounted on the second base;
extractor means for engaging an object at the bottom of a stack of said objects in the first magazine and for inserting said object into the second magazine,
an actuator mounted on the support member and adapted to be energized,
means connecting the extractor means to the actuator, said actuator when energized causing the extractor means to cycle between a first position in which the extractor means is positioned to engage an object at the bottom of the stack of said objects in the first magazine and a second position in which an object engaged by the extractor is inserted into the second magazine,
the object being inserted into the second magazine contacting the cam surface of the cam means to forcibly move upwardly any of such objects stacked in the second magazine, whereby the object being transferred becomes the bottommost object in the second magazine.

2. A mechanism for transferring the bottommost object of a first stack of such objects stored in a transferor magazine to a transferee magazine and for vertically stacking the transferred objects in a second stack in the transferee magazine by inserting each transferred object into the bottommost position of the second stack;
each of said objects hving a substantially uniform thickness, the top and bottom surfaces being substantially rectangular and having a length and a width,
the transferor and transferee magazines each having wall means including a front wall, a back wall and side walls; a pair of rails; each rail having a substantially planar top and bottom surface which planar surfaces are substantially parallel to one another, said rails being attached at the bottom of the side walls so that they are spaced apart, and are parallel to the side walls; the inner surfaces of the walls and top surfaces of the rails defining a space having a substantially rectangular cross section in which a plurality of said objects can be stacked, the bottom surface of the front wall and the top surfaces of the rails of each magazine defining a front opening througjh which only one of said objects can fit at a time; said mechanism comprising:
a support member,
a transferor base mounted on said support member,
means for removably mounting a transferor magazine on the first base so that the planar surfaces of the rails of the transferor magazine are substantially horizontal;
means for forming an opening through the transferor base,
positioning means mounted on said support member;
a transferee base mounted on the positioning means;
means for removably mounting a transferee magazine on the transferee base so that the positioning means position the transferee base with respect to the transferor base so that the front wall of the transferee magazine substantially faces the front wall of the transferor magazine and so that the planes determined by surfaces of the rails of the two magazines are substantially co-planar;
means forming an opening through the transferee base;
cam means having a cam surface, said cam means being mounted on said transferee base so that a part of the cam surface projects above the upper surface of the rails of the second magazine;
an extractor having a first substantially horizontal surface, a second substantially vertical surface, and a third cam surface;
an actuator mounted on the positioning means and adapted to be energized;
connecting means mounted in the means forming an opening through the transferee base for operatively connecting the extractor to the actuator, said actuator when energized causing the extractor to cycle between a first position in which the vertical surface of the extractor is beyond the inner surface of the back wall of the transferor magazine and a second position in which the vertical surface of the extractor extends slightly beyond the inner surface of the front wall of the transferee magazine by movement of the extractor in the openings in the transferor and transferee bases; said extractor being secured to the connecting means so that a part of the vertical surface of the extractor projects above the top surfaces of the rails of the transferor magazine to engage the bottommost object stacked in the first magazine;

the distance between the transferor and transferee bases being such that an object being transferred contacts the rail of the transferee magazine before contact with the rails of the transferor means is broken; and the highest point of the cam surface of the cam means being nearer the front wall than the back wall of a transferee magazine mounted on said transferee base, so that objects stacked within the transferee magazine will be positioned so that the bottommost object will not block the opening in the front wall; whereby when the extractor is cycled from its second position to its first and back to its second by the actuator, the extractor transfers an object from the transferor magazine to the transferee, the object being transferred being inserted through the bottom opening of the transferee magazine which causes said object to engage the cam surface of the cam means mounted on said transferee base to displace the stack of such objects previously loaded into the transferee magazine so that the object being transferred will be the bottommost object in the transferee magazine.

3. A transfer mechanism for removing fixtures from a first stack in a first magazine and for inserting fixtures into the bottom of a second stack in a second magazine;

each of said fixtures comprising a layer of material of substantially uniform thickness, the top and bottom surfaces of which are substantially retangular and have a length and a width; each fixture having an opening substantially in the center thereof, said opening having a uniform width, and means for mounting an integrated circuit chip which in turn is mounted on a flexible lead frame which frame is secured to the fixture so that the chip lies in the opening between the top and bottom surfaces of the fixture;

each of said magazines comprising a hollow tube having a back wall and a front substantially planar rectangular wall, said back and front walls having inner surfaces, a front opening formed at the bottom of the front wall, the height and width of which opening permit only one fixture to be removed or inserted at a time; a pair of rails forming the base of the magazine, the top and bottom surfaces of the rails being substantially planar and spaced apart so that the rails are substantially perpendicular to the front wall and are spaced apart a distance substantially greater than the width of the opening of said fixtures so that when a fixture is stored in a magazine, the chip and its flexible lead frame will not contact the upper surfaces of the rails said rails being mounted on the magazine so that their upper surfaces substantially lie in one plane; and a back opening formed in the back wall of the second magazine the minimum height of the opening above the top surfaces of the rails being a substantial portion of the thickness of a fixture and the width of which is not greater than the distance between the rails;

said mechanism comprising:

a support member;

a first base mounted on the support member;

first means for removably mounting a first magazine on the first base;

means forming a channel through the first base, the channel having a width and depth, the width being substantially equal to the distance between the rails of a magazine;

a second base mounted on the frame member;

second means for removably mounting a second magazine on the second base, said second base being positioned in relation to the first base so that the front wall of the second magazine substantially faces the front wall of the first magazine, so that the distance between the two magazines is substantially not greater than one half of the length of a fixture, and so that the top surfaces of the rails of the magazines are substantially co-planar;

means forming an opening through the second base, said opening having a width and a depth, cam means having cam surfaces, said cam surfaces mounted on said second base, so that the cam surfaces project above the plane determined by the top surfaces of the rails of the second magazine, the highest points of the cam surfaces being closer to the front wall of the second magazine than to its back wall;

an extractor having a substantially horizontal first surface, a substantially vertical second surface, and a cam third surface, the first surface being substantially co-planar with the top surfaces of the rails of the magazines, the height of the vertical surface being not greater than the thickness of a fixture, and the cam surface extending from the top of the vertical surfaces until it is below the first surface, said extractor adapted to fit within the width of the means forming a channel in the first base and partially within the means forming an opening through the second base;

an actuator mounted on said support member, means operatively connecting the actuator to the extractor for linear movement of the extractor substantially parallel to the side walls of the rails of magazines mounted on said first and said second bases from a first position in which the vertical surface of the extractor is substantially co-planar with the inner surface of the back wall of the first magazine to a second position in which the vertical surface is substantially co-planar with the inner surface of the front wall of the second magazine; and means for operatively connecting the extractor to the actuator, said means being located in the means forming an opening in the second base to cause the extractor to move from its second position to its first position and to return to its second position to transfer fixtures stacked in the first magazine mounted on said first base to the second magazine mounted on said second base.

4. A transfer mechanism adapted to transfer substantially identical fixtures from a first stack of said fixture in a transferor magazine to a transferee magazine by inserting the fixture being transferred into the bottom of a second stack of said fixtures in the transferee magazine;

each fixture being formed of a laminar layer of material the top and bottom surfaces of which are substantially square, said surfaces having a length and width, and a thickness, each fixture having an opening having a width of and a length substantially in the center thereof, and adapted to have an integrated circuit chip mounted on a flexible lead frame attached to the fixture so that the chip is within said opening between the top and bottom surfaces of a fixture;

each magazine having a hollow rectangular tube with a front, back and side substantially planar walls; a front opening formed at the bottom of the front wall through which only one fixture at a time can be removed or inserted; a pair of rails attached at the bottom of the side walls of the tube to form the base of the magazine, the top and bottom surfaces of the rails being substantially planar, said rails being attached to the side walls so that they are spaced apart and substantially parallel to each other and to the side walls of the magazine, the space between the rails being greater than the width of the opening in a fixture; the upper surfaces of the rails substantially defining a first plane, and back opening formed at the bottom of the back wall of the magazine, said transfer mechanism comprising:

a support plate;

a transferor base mounted on the support plate;

mounting means on the transferor base for removably mounting a transferor magazine on the transferor base;

means forming a channel through the transferor base, the channel having a width and depth, the width of the channel being substantially equal to the distance between the rails of a transferor magazine;

positioning means mounted on the support plate;

a transferee base mounted on the positioning means;

mounting means on the transferee base for removably mounting a second magazine on the transferee base, said transferee base being positioned so that the front wall of the second base faces the front wall of the first base, so that the distance between the two magazines is substantially not greater than one half of the length of a fixture, and so that first planes of the magazine are substantially co-planar;

means forming an opening through the transferee base, said opening having a width and a height, cam means having a pair of substantially identical cam surfaces mounted on said transferee base, said cam surfaces being spaced apart a distance substantially equal to the width of the opening in a fixture, the highest points of each cam surface projecting above said first plane of a transferee magazine when a transferee magazine is mounted on the transferee base, the maximum height of the cam surface being located closer to the front wall of the magazine than the back;

an extractor having a pair of horizontal first surfaces, a pair of vertical second surfaces and a pair of cam third surfaces the first surfaces being below the first planar surfaces of the first and second magazines, the height of vertical surfaces of the extractor above said first planar surfaces being not greater than the thickness of a fixture, and the cam surfaces extending from the top of the vertical surfaces to below said first planar surfaces, the minimum distance between each pair of first, second and third cam surfaces substantially equalling the width of the opening in a fixture, said extractor adapted to fit within the width of the means forming a channel in a transferor base and within at least a part of the means forming an opening through the transferee base, an actuator mounted on said positioning means, means operatively connecting the actuator to the extractor for linear reciprocating movement of the extractor in a direction substantially parallel to the rails of the transferor and transferee magazines between a first position in which the vertical surfaces of the extractor can engage the back wall of the bottommost fixtures in the transferor magazine to a second position in which a fixture engaged by the vertical wall is located within the second magazine, the means for operatively connecting the extractor to the actuator being located in the means forming an opening in the transferee base and in the means forming an opening in the transferor base when the extractor is in its first position.

* * * * *